(12) United States Patent
Tsai

(10) Patent No.: US 11,469,319 B2
(45) Date of Patent: Oct. 11, 2022

(54) SEMICONDUCTOR DEVICE WITH RECESSED ACCESS TRANSISTOR AND METHOD OF MANUFACTURING THE SAME

(71) Applicant: NANYA TECHNOLOGY CORPORATION, New Taipei (TW)

(72) Inventor: Tsung-Yu Tsai, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 177 days.

(21) Appl. No.: 16/845,673

(22) Filed: Apr. 10, 2020

(65) Prior Publication Data
US 2021/0320201 A1    Oct. 14, 2021

(51) Int. Cl.
*H01L 29/78* (2006.01)
*H01L 29/06* (2006.01)
*G11C 5/06* (2006.01)

(52) U.S. Cl.
CPC .......... *H01L 29/7812* (2013.01); *G11C 5/063* (2013.01); *H01L 29/0653* (2013.01)

(58) Field of Classification Search
CPC combination set(s) only.
See application file for complete search history.

(56) References Cited

U.S. PATENT DOCUMENTS

2011/0284954 A1* 11/2011 Hsieh .................. H01L 29/1095
                                                           257/331
2020/0075727 A1*  3/2020 Basu .................. H01L 29/66545
2021/0202724 A1*  7/2021 Rahimo ............... H01L 29/0696

FOREIGN PATENT DOCUMENTS

| CN | 107799570 A | * | 10/2017 | ......... | H01L 29/7869 |
| CN | 110383489 A | | 10/2019 | | |
| CN | 110931552 A | | 3/2020 | | |
| TW | 508793 B | | 11/2002 | | |
| TW | 201242020 A | | 10/2012 | | |
| TW | 201342609 A | | 10/2013 | | |
| TW | 201438196 A | | 10/2014 | | |
| TW | I685841 B | | 2/2020 | | |

OTHER PUBLICATIONS

Office action dated Dec. 2, 2021 in corresponding TW Application 110110208, 10 pages.

* cited by examiner

*Primary Examiner* — Moin M Rahman
*Assistant Examiner* — Mohammad A Rahman
(74) *Attorney, Agent, or Firm* — Muncy, Geissler, Olds & Lowe, P.C.

(57) ABSTRACT

The present disclosure provides a semiconductor device and a method of manufacturing the semiconductor device. The semiconductor device includes a substrate, a word line, a plurality of first impurity regions, a second impurity region, and an isolation film. The word line is W-shaped, is disposed in the substrate, and includes a base and a pair of legs connected to the base. The first impurity regions are disposed in the substrate and on either side of the word line. The second impurity region is disposed between the legs of the word line. The isolation film is disposed in the substrate, wherein the word line is surrounded by the isolation film.

9 Claims, 21 Drawing Sheets

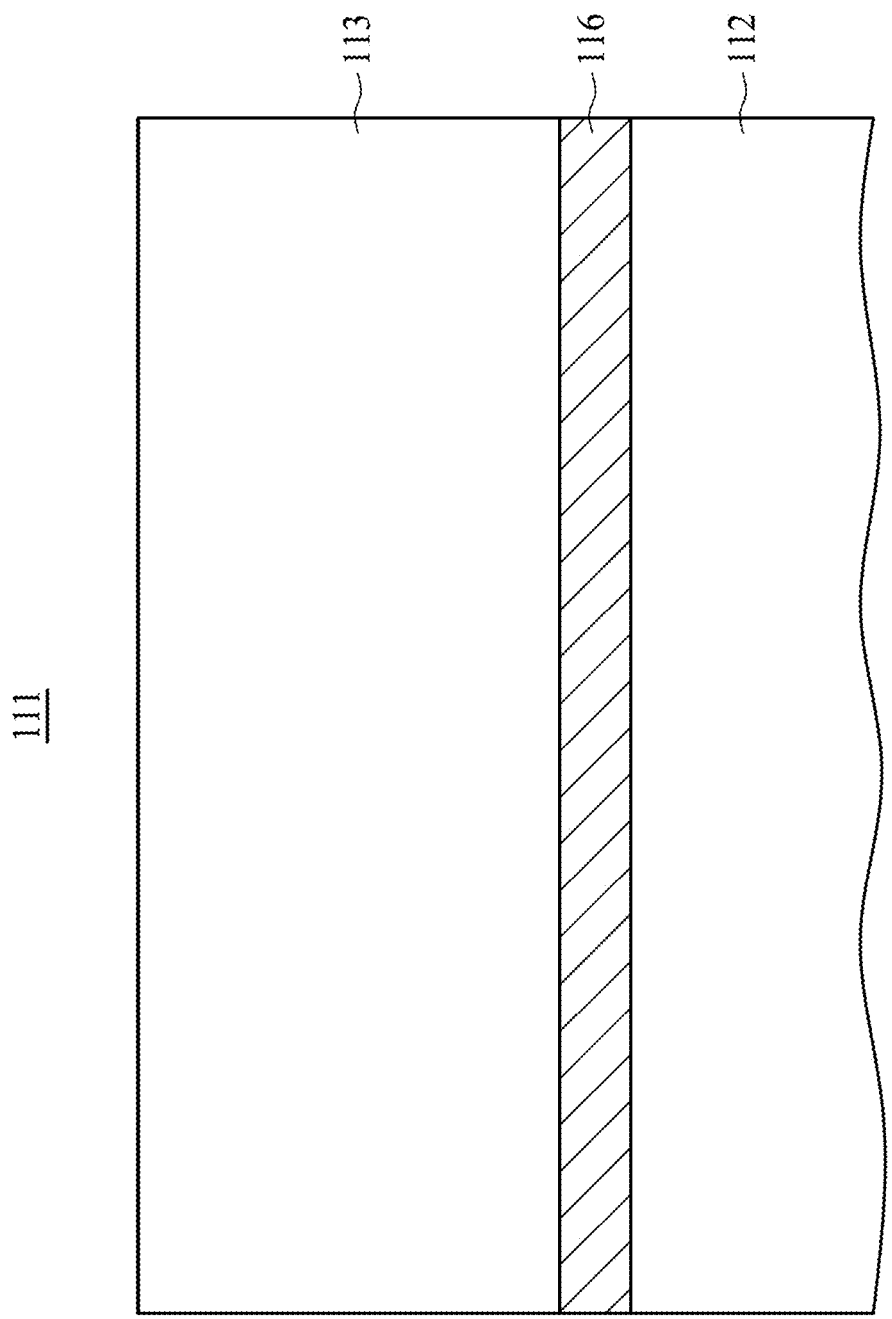

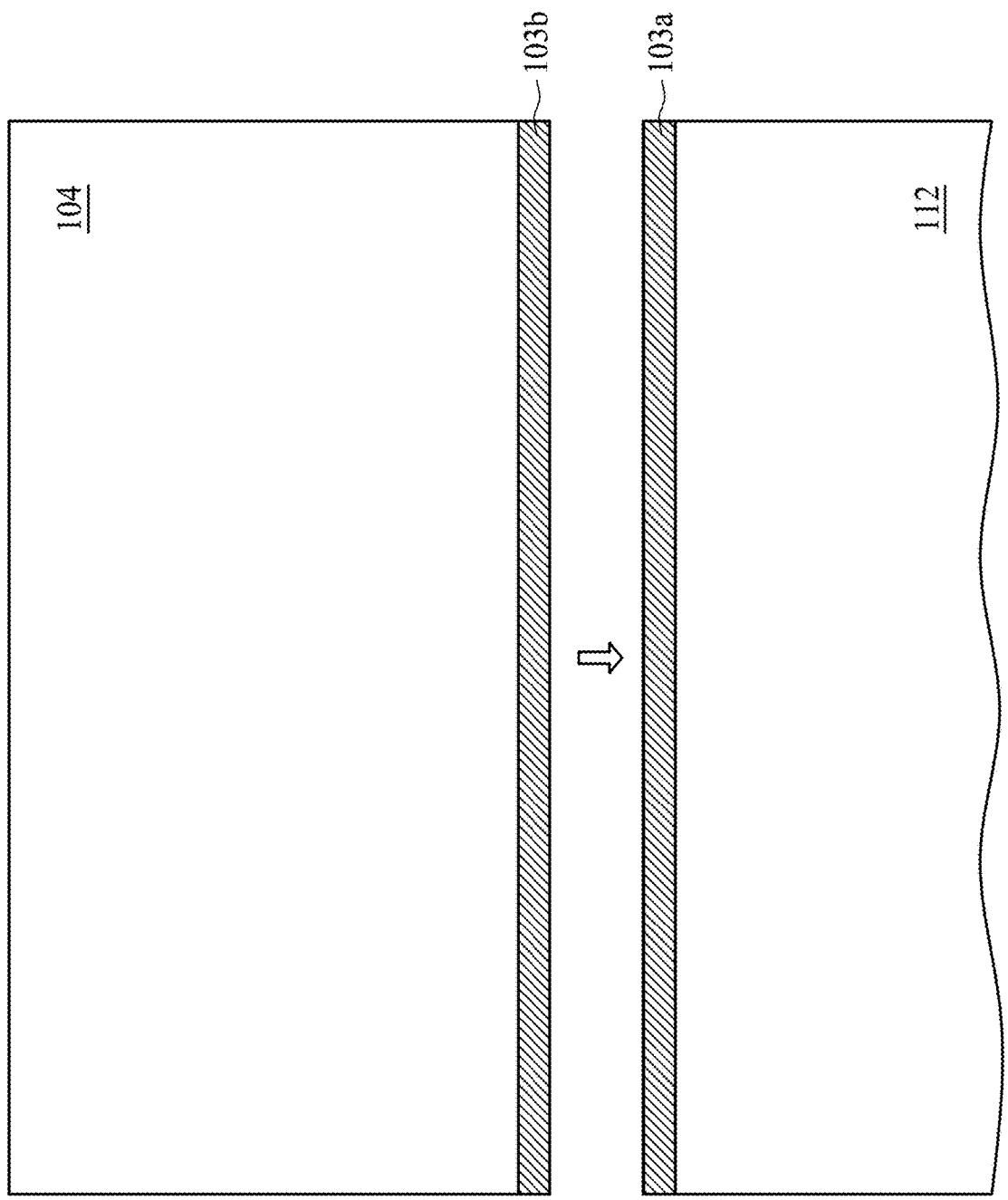

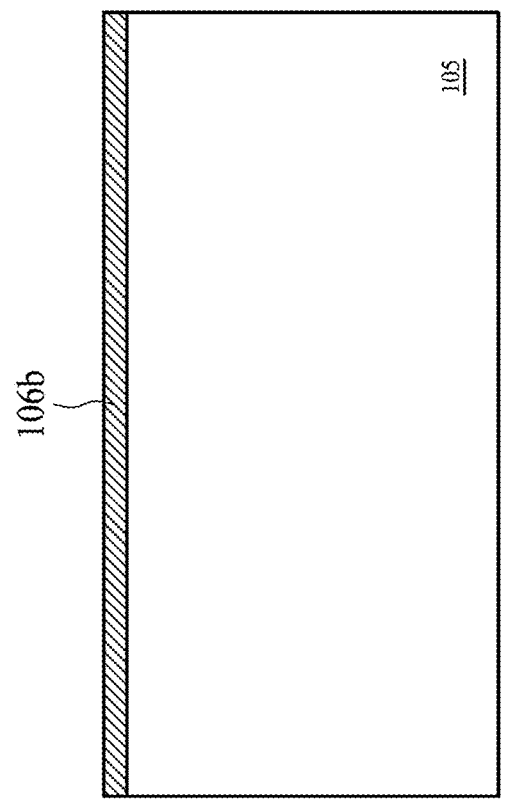
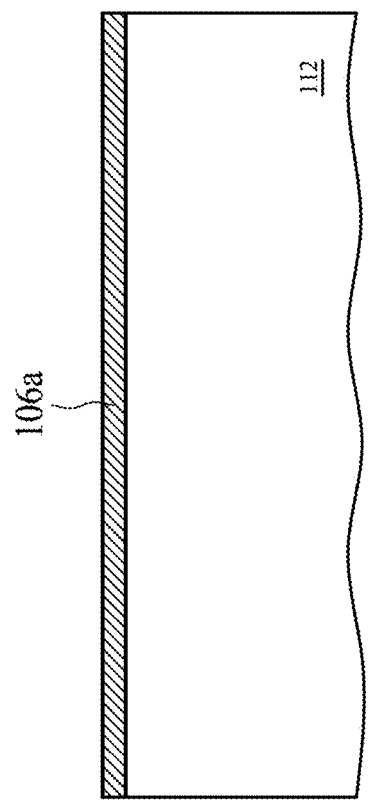
FIG. 5D

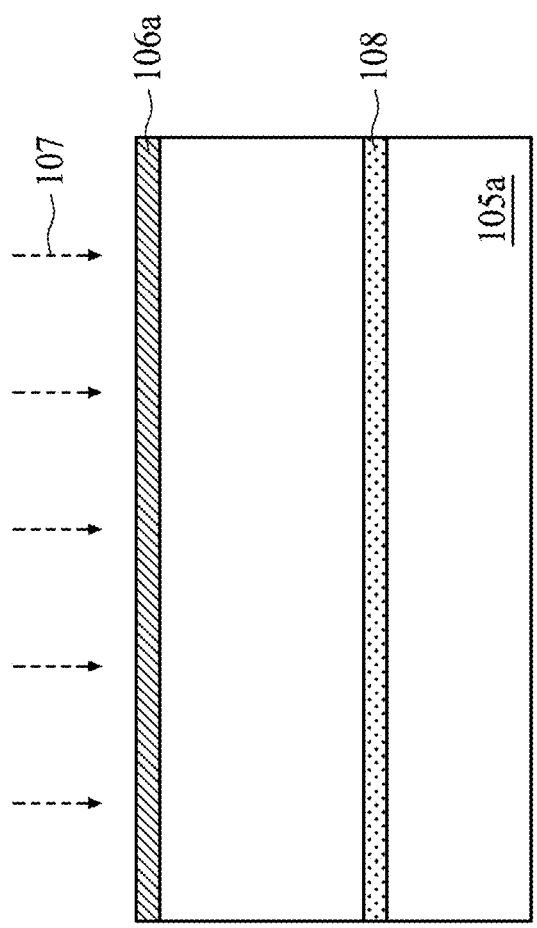

SEMICONDUCTOR DEVICE WITH RECESSED ACCESS TRANSISTOR AND METHOD OF MANUFACTURING THE SAME

TECHNICAL FIELD

The present disclosure relates to a semiconductor device and a manufacturing method of the semiconductor device, and more particularly, to a semiconductor device including a recessed access device (RAD) transistor and a manufacturing method of the semiconductor device including the RAD transistor.

DISCUSSION OF THE BACKGROUND

Manufacturers of various semiconductor devices, such as memory devices, logic devices and microprocessors, share the common goal of miniaturization. As feature sizes decrease, the electrical operation of the transistor becomes more difficult. One contributing factor to such difficulty, the short-channel effect, arises when the width of the transistor channel becomes excessively small due to miniaturization. This may result in the transistor activating even though a threshold voltage (Vt) has not been applied to the gate.

A new type of transistor, known as a recessed access device ("RAD") transistor, has been developed to overcome the short-channel effect suffered by conventional transistors by forming a wider channel in the same horizontal space. The RAD transistor comprises a transistor gate (word line) having a U-shaped contour when viewed from a cross-sectional perspective, that is formed partially within a trench in a semiconductor wafer. The channel region is formed along the entire surface of the trench, thereby providing a wider channel without increasing the amount of lateral space required by the transistor. However, with increases in DRAM bit density, the overlay between transistor gates and the source/drain junction depth create a challenge due to variations in the etching process.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device. The semiconductor device includes a substrate, a word line, a plurality of first impurity regions, and an isolation film. The word line is disposed in the substrate and includes a base and a pair of legs connected to the base. The first impurity regions are disposed in the substrate and on either side of the word line. The isolation film is disposed in the substrate, wherein the word line is surrounded by the isolation film.

In some embodiments, the semiconductor device further includes a second impurity region disposed in the substrate and between the legs of the word line.

In some embodiments, the second impurity region has a width that gradually increases at positions of increasing distance from the base of the word line.

In some embodiments, sections of the isolation film attached to the legs of the word line are connected with each other.

In some embodiments, the isolation film includes a pair of curved sections and a horizontal section connected to the curved sections, the curved sections are attached to the legs of the word line, and the horizontal section is sandwiched between the base of the word line and the second impurity region.

In some embodiments, the substrate and the second impurity region and the first impurity regions have the same conductivity type, and the first impurity regions and the second impurity region have different conductivity types.

In some embodiments, the substrate has a first doping concentration, and the first impurity regions have a second doping concentration greater than the first doping concentration.

In some embodiments, the substrate includes a first semiconductor layer, a second semiconductor layer and an insulator layer disposed between the first and second semiconductor layers, wherein the word line, the first and second impurity regions, and the isolation film are disposed in the second semiconductor layer of the substrate, and the legs of the word line are disposed between the base of the word line and the insulator layer.

In some embodiments, the base and the legs of the word line are integrally formed.

In some embodiments, the semiconductor device further includes a passivation layer disposed in the substrate and capping the base of the word line.

In some embodiments, the passivation layer is surrounded by the isolation film.

In some embodiments, the passivation layer contacts the first impurity regions.

Another aspect of the present disclosure provides a method of manufacturing a semiconductor device. The method includes steps of providing a patterned mask having a plurality of openings on a substrate; etching the substrate through the openings to form an etched substrate and a trench in the etched substrate, wherein the etched substrate comprises a protrusion; introducing dopants having a first conductivity type in the etched substrate and on either side of the trench to form a plurality of first impurity regions; forming an isolation film in the trench; and depositing a conductive material on the isolation film.

In some embodiments, the method further includes a step of introducing dopants having a second conductivity type in the protrusion of the etched substrate to form a second impurity region.

In some embodiments, the method further includes a step of introducing a dopant having the first conductivity type in the substrate prior to the formation of the patterned mask, wherein the dopant in the substrate has a first doping concentration, and the dopants in the first impurity regions have a second doping concentration greater than the first doping concentration.

In some embodiments, the protrusion of the etched substrate is disposed at a center of the trench.

In some embodiments, the patterned mask, having a variation in thickness, comprises a plurality of first segments having a first thickness and at least one second segment disposed between the first segments and having a second thickness less than the first thickness, and the openings are formed between the adjacent first and second segments.

In some embodiments, the method further includes a step of recessing the conductive layer to a level below an upper surface of the substrate, thereby forming a word line.

In some embodiments, the method further includes a step of depositing a passivation layer to cap the word line.

In some embodiments, the method further includes a step of depositing a diffusion barrier film on the isolation film prior to the deposition of the conductive material.

With the above-mentioned configurations of a semiconductor device having W-shaped word line and the second impurity region having the conductivity type different from the substrate and the first impurity regions, a wider channel is provided and a bias voltage applied to the word line for controlling operation states (i.e., conducting or non-conducting states) of the RAD transistor can be reduced.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

FIG. 4 is a cross-sectional view of an intermediate stage in the formation of a semiconductor device in accordance with some embodiments of the present disclosure.

FIGS. 5A through 5G are cross-sectional views of intermediate stages in the formation of the semiconductor device in accordance with some embodiments of the present disclosure.

DETAILED DESCRIPTION

Figure 1:
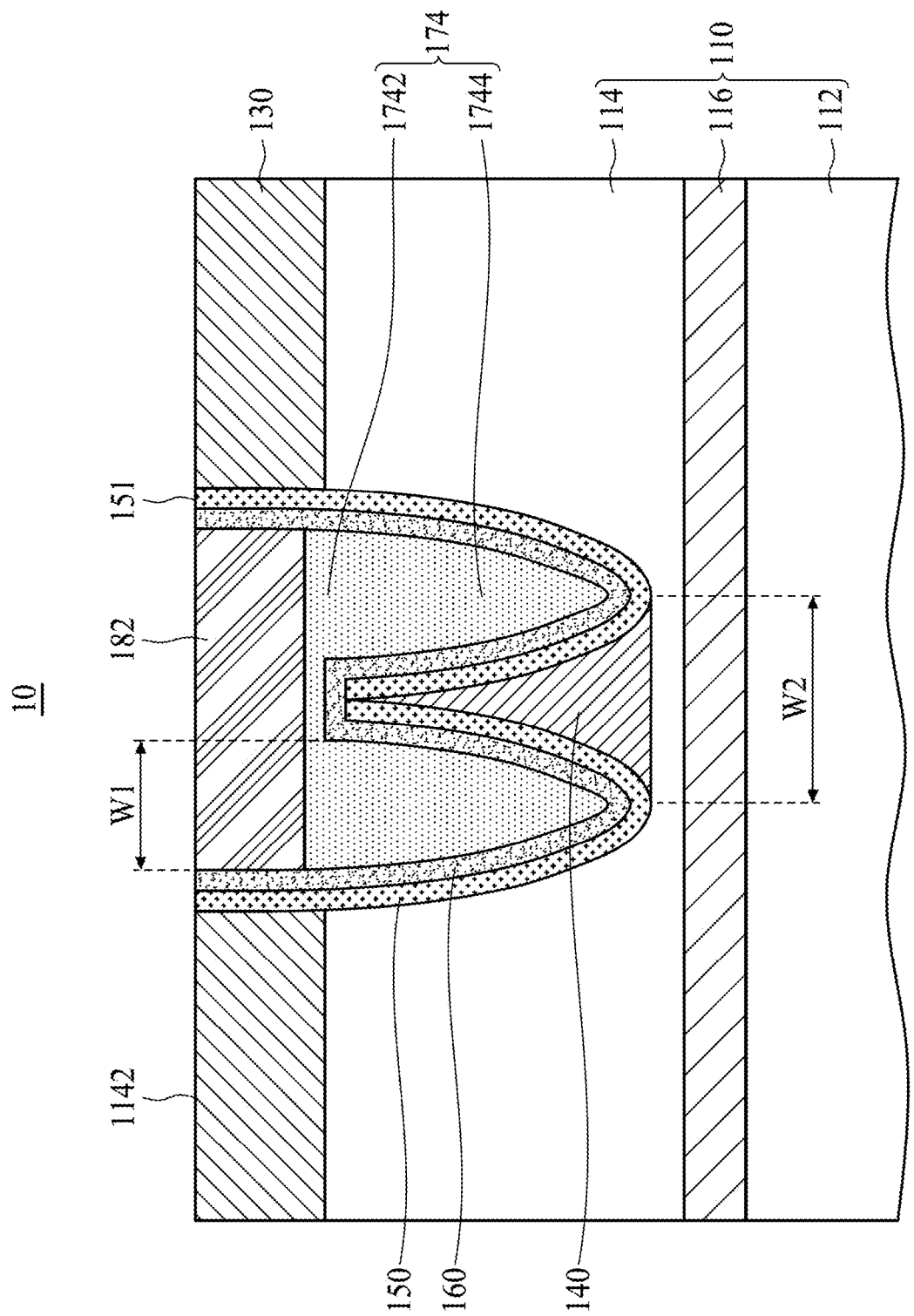
FIG. 1 is a cross-sectional view of a semiconductor device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a cross-sectional view of a semiconductor device 10 in accordance with some embodiments of the present disclosure. Referring to FIG. 1, the semiconductor device 10 includes a substrate 110, a plurality of first impurity regions 130, an isolation film 150 and a word line 174. The first impurity regions 130, the isolation film 150, and the word line 174 collectively constitute a recessed access device (RAD) transistor.

The substrate 110 is a silicon-on-insulator (SOI) substrate including a first semiconductor layer 112, a second semiconductor layer 114, and an insulator layer 116 sandwiched between the first and second semiconductor layers 112 and 114. The second semiconductor layer 114 includes silicon, for example, and has a first conductivity type. In some embodiments, the first conductivity type can be n-type.

The word line 174 is disposed in the second semiconductor layer 114 of the substrate 110 and includes a base 1742 and a pair of legs 1744 connected to the base 1742. The legs 1744 are disposed between the base 1742 and the insulator layer 116; therefore, the word line 174 has a substantially W-shaped contour from a cross-sectional perspective. The word line 174 has a wider channel than a conventional RAD transistor having a U-shaped contour.

The base 1742 and the legs 1744 of the word line 174 are integrally formed. The legs 1744 have a width W1 that gradually decreases at positions of decreasing distance from the insulator layer 116. In some embodiments, the semiconductor device 10 can include a passivation layer 182 disposed in the second semiconductor layer 114 and employed to cap the word line 174. The word line 174 is made of conductive material, such as tungsten, and the passivation layer 182 includes dielectric material including oxide or nitride.

The first impurity regions 130, serving as source and drain regions of the RAD transistor, are disposed in the second semiconductor layer 114 and on either side of the base 1742 of the word lines 174. The first impurity regions 130 are connected to the upper surface 1142 of the second semiconductor layer 114. The first impurity regions 130 have the first conductivity type. The second semiconductor layer 114 and the first impurity regions 130, having the first conductivity type, have different doping concentrations. By way of example, the second semiconductor layer 114 has a first doping concentration, and the first impurity regions 130 have a second doping concentration greater than the first doping concentration.

The semiconductor device 10 further includes a second impurity region 140 disposed between the legs 1744 of the word line 174. The second impurity region 140, separated from the first impurity regions 130, has a second conductivity type different from the first conductivity type. The second impurity region 140 can be doped with p-type dopants. Because the width W1 of the legs 1744 of the word line 174 gradually decreases at positions of decreasing distance from the insulator layer 116, the second impurity region 140, between the legs 1744 of the word line 174, has a width W2 that gradually increases at positions of increasing distance from the base 1742 of the word line 174.

The word line 174 is shielded from the first impurity regions 130 and the second impurity region 140 by the isolation film 150 therebetween, preventing dopants introduced into the first impurity regions 130 and the second impurity region 140 from migrating into the word line 174. The isolation film 150, including dielectric material, is also disposed between the word line 174 and the second semiconductor layer 114 where the first and second impurity regions 130 and 140 are not disposed to prevent junction leakage. In some embodiments, the isolation film 150 is further disposed between the word line 174 and the passivation layer 182, so that an upper surface 151 of the isolation film 150 is coplanar with the upper surface 1142 of the second semiconductor layer 114. In some embodiments, the word line 174 and the passivation layer 182 are surrounded by the isolation film 150, and the sections of the isolation film 150 attached to the legs 1744 of the word line 174 are connected to each other.

When a negative bias voltage is applied to the word line 174, free electrons (which are negative charged) are repelled from the second impurity region 140. The free electrons are pushed downward into the second semiconductor layer 114 of the substrate 110. When a sufficient number of free electrons accumulate near the surface of the second semiconductor layer 114 under the second impurity region 140 and the word line 174, an n region is in effect created, connecting the first impurity regions 130 (i.e., the source and drain regions). Therefore, when a voltage is applied between the first impurity regions 130, current flows through the induced n region. As a result, the RAD transistor is in a conductive state.

In contrast, when a positive bias voltage is applied to the word line 174, the holes in the second impurity region 140 diffuse across a junction between the second semiconductor layer 114 and the second impurity region 140 and recombine with some of the majority electrons present in the second semiconductor layer 114 and thus disappear from the scene. Such recombination process results in the disappearance of some free electrons from the n-type second semiconductor substrate 114. Therefore, in the second impurity region 140, there is a region depleted of free electrons. The electrons that diffuse across the junction can quickly recombine with some of the majority holes in the second impurity region 140, and thus disappear from the scene. As a result, in the second impurity region 140 close to the junction, there is a region depleted of holes. The depleted regions block current from flowing through the second semiconductor layer 114 when the voltage is applied between the first impurity regions 130, so that the RAD transistor is in a non-conduction state. Due to the introduction of the second impurity region 140 doped with p-type dopants, a substantially U-shape wider channel can be created when the negative bias voltage is applied to the word line 174 of the RAD transistor in which the second semiconductor layer 114 and the first impurity regions 130 are doped with n-type dopants, and the bias voltage applied to the word line 174 for controlling the operation of the RAD transistor can be reduced.

The semiconductor device 10 can optionally include a diffusion barrier film 160 disposed between the isolation film 150 and the word line 174. The diffusion barrier film 160 functions as an adhesive layer to prevent the word line 174 from flaking or spalling from the isolation film 150.

Figure 2:
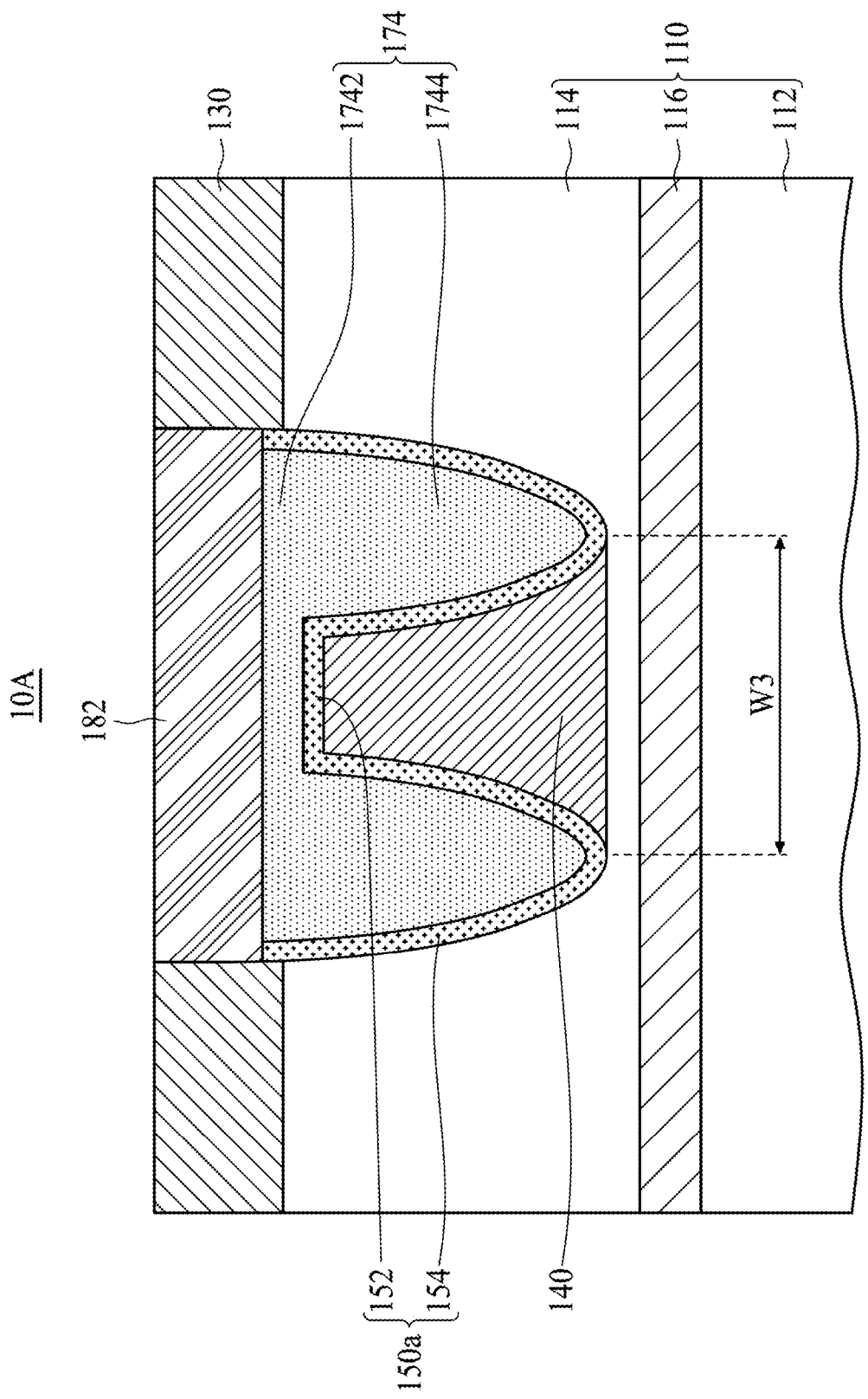
FIG. 2 is a cross-sectional view of a semiconductor device in accordance with some embodiments of the present disclosure.

FIG. 2 is a cross-sectional view of a semiconductor device 10A in accordance with some embodiments of the present disclosure. Referring to FIG. 2, the semiconductor device 10A includes a substrate 110, a plurality of first impurity regions 130, a second impurity region 140a, an isolation film 150, a word line 174, and a passivation layer 182. The substrate 110 includes a first semiconductor layer 112, a second semiconductor layer 114 and an insulator layer 116, wherein the first and second semiconductor layers 112 and 114 are disposed on either side of the insulator layer 116. The word line 174 includes a base 1742 and a pair of legs 1744 connected to the base 1742, wherein the legs 1744 are disposed between the base 1742 and the insulator layer 116. The base 1742 and the legs 1744, integrally formed, are made of conductive material, such as tungsten.

The first impurity regions 130 are disposed in the second semiconductor layer 114 and disposed on either side of the word line 174, and the second impurity region 140 is disposed between the base 1742 and the legs 1744 of the word line 174. The second impurity region 140 has a tapering width W3, which gradually decreases at positions of decreasing distance from the base 1742 of the word line 174. The first impurity regions 130 are doped with dopants having a first conductivity type, and the second impurity region 140a is doped with dopants having a second conductivity type. The second semiconductor layer 114 of the substrate 110 can also be doped with dopants having the first conductivity type, wherein the second semiconductor layer 114 of the substrate 110 has a first doping concentration, and the first impurity regions 130 have a second doping concentration greater than the first doping concentration. In some embodiments, the second impurity region 140a can have a third doping concentration substantially equal to the second doping concentration.

Referring to FIGS. 1 and 2, due to the second impurity region 140a shown in FIG. 2 has the width W3 greater than the width W2 of the second impurity region 140 shown in FIG. 1, an amount of the dopants introduced into the second impurity region 140a shown in FIG. 2 is greater than that introduced into the second impurity region 140 shown in FIG. 1. Therefore, the bias voltage applied to the word line 174 for activating the semiconductor device 10A shown in FIG. 2 can be further reduced.

Referring again to FIG. 2, due to the second impurity region 140 has a substantially trapezoid shape, the isolation film 150a, disposed in the second semiconductor layer 114, includes a horizontal section 152 and a pair of curved sections 154 connected to both ends of the horizontal section 152. The horizontal section 152 is sandwiched between the second impurity region 140 and the base 1742 of the word line 174, and the curved sections 152 are attached to the legs 1744 of the word line 174. The passivation layer 182 capping the word line 174 is disposed in the second semiconductor layer 114 and contacts the first impurity regions 130.

Figure 3:
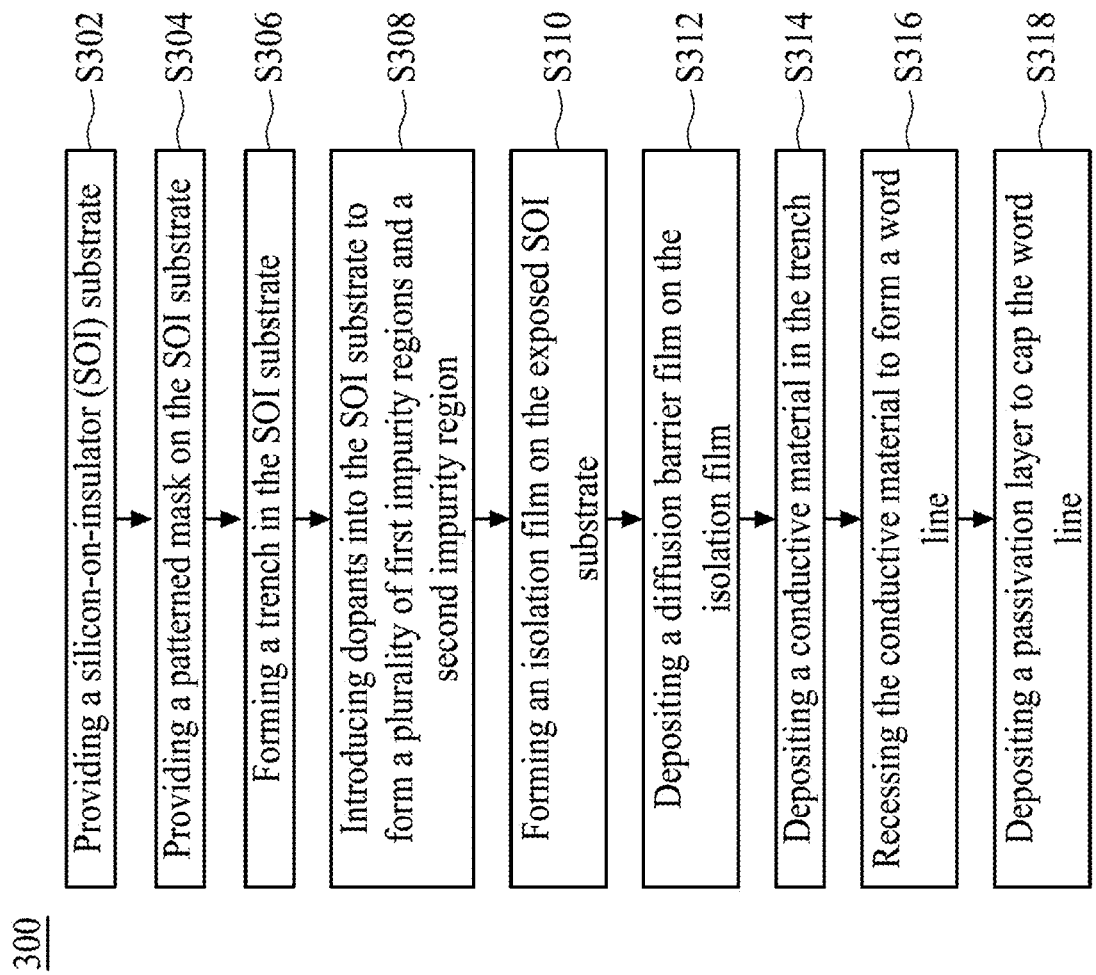
FIG. 3 is a flow diagram illustrating a method of manufacturing a semiconductor device in accordance with some embodiments of the present disclosure.

FIG. 3 is a flow diagram illustrating a method of manufacturing a semiconductor device 10 in accordance with some embodiments of the present disclosure, and FIGS. 4 through 14 illustrate cross-sectional views of intermediate stages in the formation of the semiconductor device 10 in accordance with some embodiments of the present disclosure. The stages shown in FIGS. 4 to 14 are also illustrated schematically in the flow diagram in FIG. 3. In the following discussion, the fabrication stages shown in FIGS. 4 to 14 are discussed in reference to the process steps shown in FIG. 3.

Referring to FIG. 4, a silicon-on-insulator (SOI) substrate 111 is provided according to a step S302 in FIG. 3. The SOI substrate 111 includes a first semiconductor layer 112, a second semiconductor layer 113 and an insulator layer 116, wherein the first and second semiconductor layers 112 and 113 are disposed on either side of the insulator layer 116. The insulator layer 116 can include oxide, such as silicon dioxide, for diminishing a short-channel effect of the semiconductor device 10.

Figure 5A:
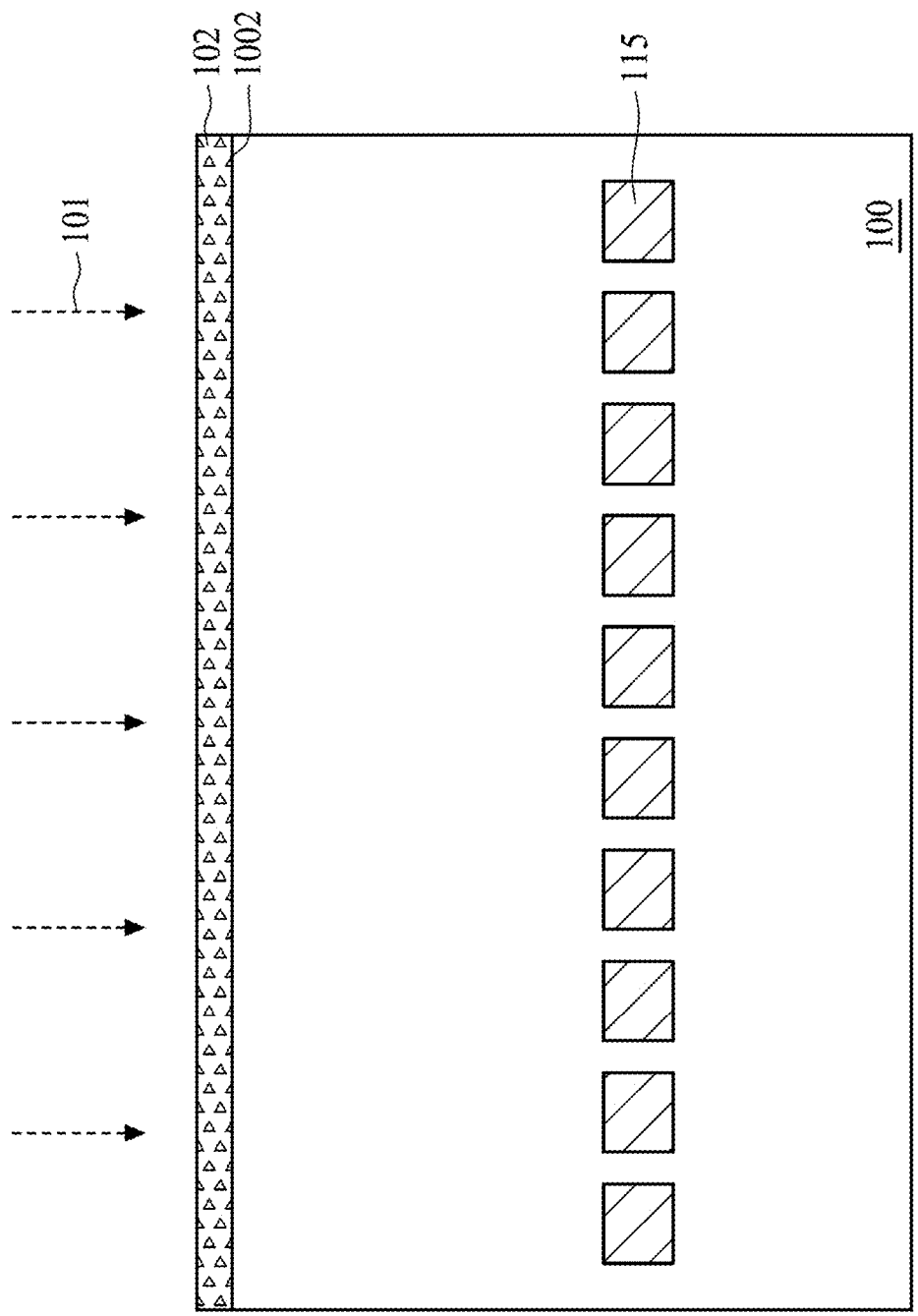

In some embodiments, the SOI substrate 111 can be fabricated using a separation by implanted oxygen (SIMOX) process, as shown in FIG. 5A. Referring to FIG. 5A, the SOI substrate 110 can be formed by steps including (1) providing a bulk semiconductor wafer 100, (2) applying an ion beam 101 including ions accelerated by an electric field to the semiconductor wafer 100, so as to form oxide precipitates 115, and (3) implementing an annealing step to form the uniform and buried insulator layer 116 with distinct interfaces with the first and second semiconductor layers 112 and 113, as shown in FIG. 4.

More particularly, oxygen ions implanted in the semiconductor wafer 100 containing silicon react with the silicon to from silicon dioxide precipitates; however, the implantation causes considerable damage to the semiconductor wafer 100 and the layer of the silicon dioxide precipitates is not continuous. The high-temperature annealing step can help repair the damage and form the silicon dioxide precipitates into a uniform and continuous insulator layer 116. In other words, the annealing step redistributes the implanted oxygen ions and chemically bonds the oxygen ions to the silicon in the semiconductor wafer 100 to form a continuous buried layer of silicon dioxide, thereby separating the second semiconductor layer 113, on which one or more semiconductor components, including at least one RAD transistor, are to be manufactured, from the first semiconductor layer 112. That is, the first and second semiconductor layers 112 and 113 of the SOI substrate 111 fabricated using the SIMOX technology have the same semiconductor material.

Referring again to FIG. 5A, a protective layer 102 can be formed on a front surface 1002 of the semiconductor wafer 100 prior to the ion implantation. The protective layer 102 is formed for the purpose of preventing the semiconductor wafer 100 from being contaminated by an impurity and from being damaged by shock of applying ions during the implantation step. The protective layer 102 can include silicon-containing insulative material, such as silicon dioxide, silicon nitride or silicon oxynitride. The protective layer 102 including silicon dioxide can be formed using a thermal oxidation process or a chemical vapor deposition (CVD) process, while the protective layer 102 including silicon nitride or silicon oxynitride can be formed using a CVD process. The protective layer 102 is removed using a wet etching process, for example, after the annealing step is performed.

Figure 5C:
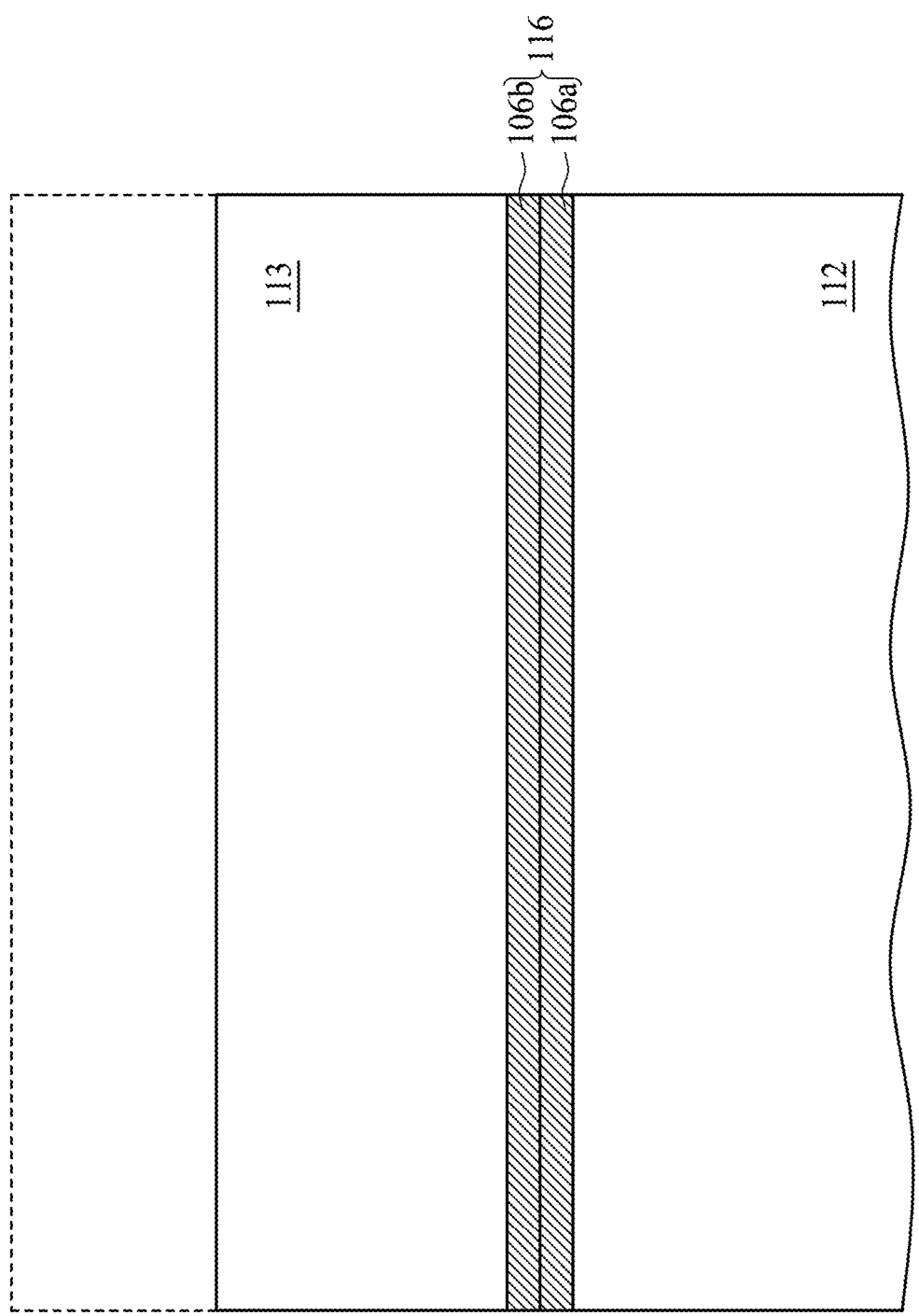
Figure 5F:
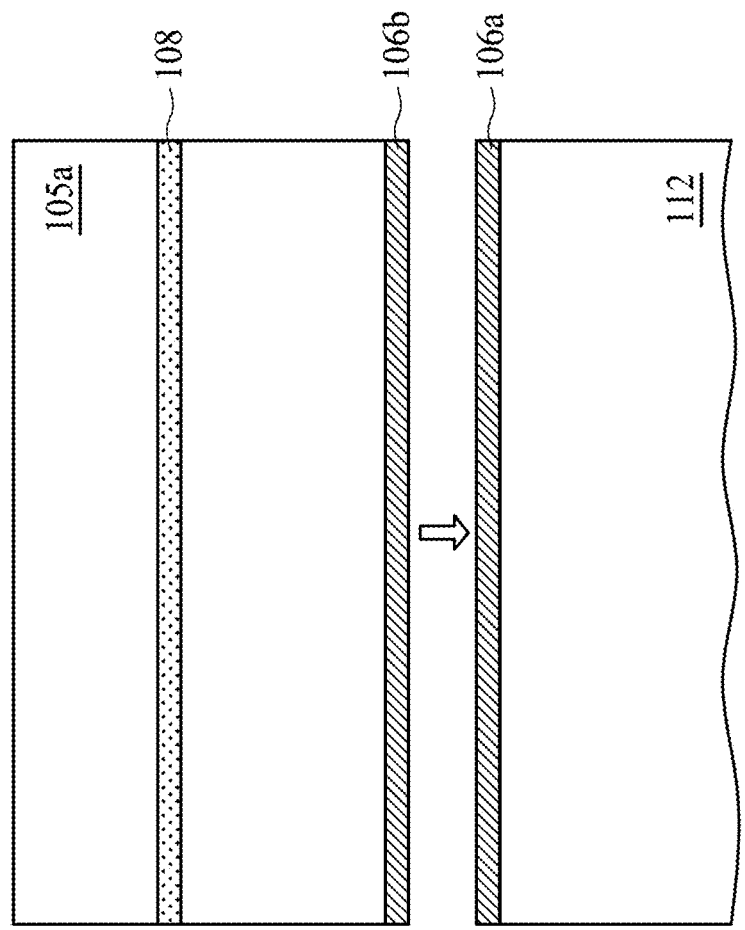

The SOI substrate 111 can be a bond and etch-back SOI substrate 110 fabricated using steps shown in FIGS. 5B and 5C in some embodiments. Referring to FIGS. 5B and 5C, the SOI substrate 111 can be formed by steps including (1) mating a device wafer 104 on a first semiconductor layer 112 by using insulative films 103a and 103b respectively capping the first semiconductor layer 112 and the device wafer 104, (2) performing a thermal treatment to fuse the insulative films 103a and 103b, thereby forming the insulator layer 116 and increasing bonding strength of the first semiconductor layer 112 and the device wafer 104; and (3) thinning the device wafer 102 to form the second semiconductor layer 113 having a desired thickness as shown in FIG. 4. In FIG. 5C, the dotted line marks an original thickness of the device wafer 104.

The first semiconductor layer 112 and the device wafer 104 are semiconductor wafers containing silicon, and the insulative films 103a and 103b can be formed by one or more thermal dioxide processes. The first semiconductor layer 112 and the device wafer 104 are tightly bonded by using bonding chemistry between the insulative films 103a and 103b including oxide. Alternatively, the device wafer 104 can be bonded to first semiconductor layer 112 by using bonding chemistry between silicon contained in the device wafer 104 and insulator layer 116 capping the first semiconductor layer 112. The thinning of the device wafer 104 may be implemented using a suitable technique such as a grinding process, a polishing process and/or a chemical etching process.

Figure 5G:
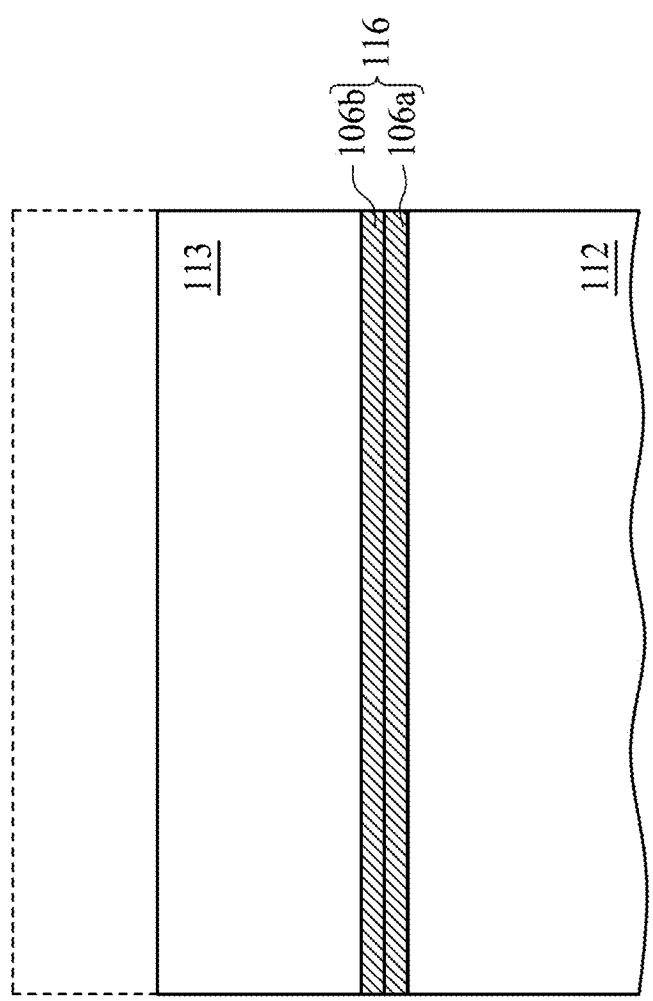

In some embodiments, the SOI substrate 111 may be fabricated using a SMARTCUT technology, as shown in FIGS. 5D to 5G. Referring to FIGS. 5D to 5G, the SOI substrate 110 can be formed by steps including (1) forming insulative films 106a and 106b on a first semiconductor layer 112 and a device wafer 105, respectively, (2) applying an ion beam 107 to implant hydrogen ions in the device wafer 105 to formed an implanted wafer 105a including an implanted zone 108, (3) mating the device wafer 105a to the first semiconductor layer 112 by bringing the insulative films 106a and 106b into contact with each other, (4) fusing the insulative films 106a and 106b to form an insulative layer 116, (5) performing an annealing process to create connecting voids from a hydride formation in the implanted zone 108, and (6) removing a portion of the implanted device wafer 105a along the implanted zone 108 including the connected voids, thereby forming the second semiconductor layer 113 shown in FIG. 4. In FIG. 5G, the dotted line marks an original thickness of the device wafer 105.

Figure 6:
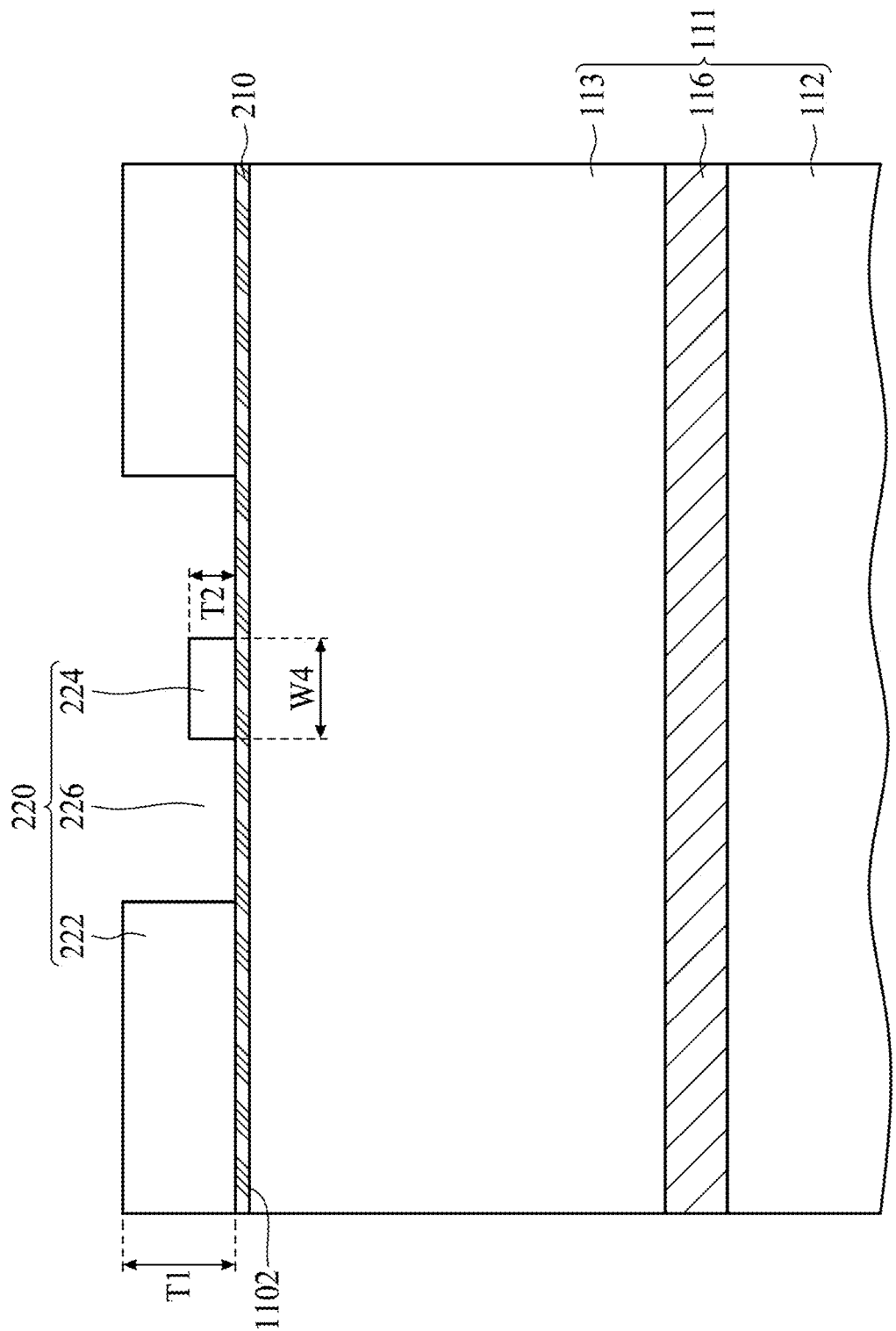
FIG. 6 is a cross-sectional view of an intermediate stage in the formation of a semiconductor device in accordance with some embodiments of the present disclosure.

Referring to FIG. 6, a patterned mask 220 is formed on the second semiconductor layer 113 of the SOI substrate 110 according to a step S304 in FIG. 3. The patterned mask 220 defines a pattern for etching of the second semiconductor layer 113 of the SOI substrate 110. In some embodiments, a buffer layer 210 can be optionally provided between the SOI substrate 110 and the patterned mask 220 to protect against contamination and mitigate stress at the interface between the SOI substrate 110 and the patterned mask 220. The buffer layer 210 can include silicon oxide or silicon dioxide. In some embodiments, the buffer layer 210 is formed using a CVD process. In alternative embodiments, the buffer layer 210 can be formed using a thermal oxidation process while the second semiconductor layer 113 of the SOI substrate 110 includes silicon.

The patterned mask 220, defining the pattern to be etched through the buffer layer 210 and into the SOI substrate 100, includes a plurality of first segments 222 having a first thickness T1 and at least one second segment 224 between the adjacent first segments 222, wherein the second segment 224 has a second thickness T2 less than the first thickness T1. The second segments 224 are separated from the first segments 222, so that a plurality of openings 226 to which portions of the buffer layer 210 are exposed are created between the first segments 222 and the second segments 224.

The patterned masked 220 can be a photoresist mask or a hard mask. The patterned mask 220, including photosensitive material, can be formed by performing at least one exposure process and at least one develop process on a photosensitive material that fully covers the buffer layer 210, wherein the photosensitive material may be applied on the buffer layer 210 by a spin-coating process and then dried using a soft-baking process. The patterned mask 220, being a hard mask, can made of polysilicon, carbon, inorganic materials (such as nitride) or other suitable material, and can be achieved using photolithography.

Figure 7A:
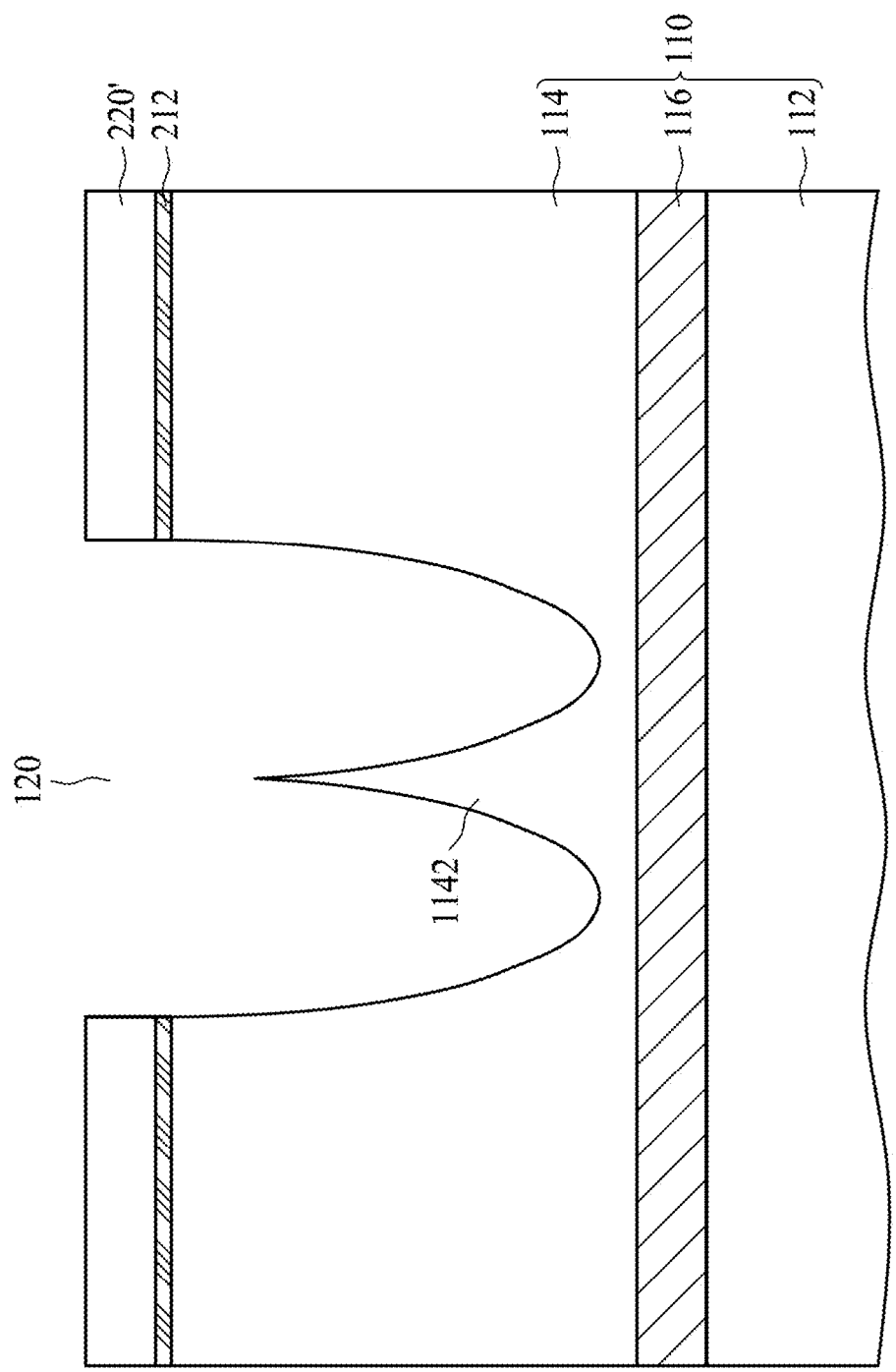
FIGS. 7A through 7B are cross-sectional views of intermediate stages in the formation of the semiconductor device in accordance with some embodiments of the present disclosure.
Figure 7B:
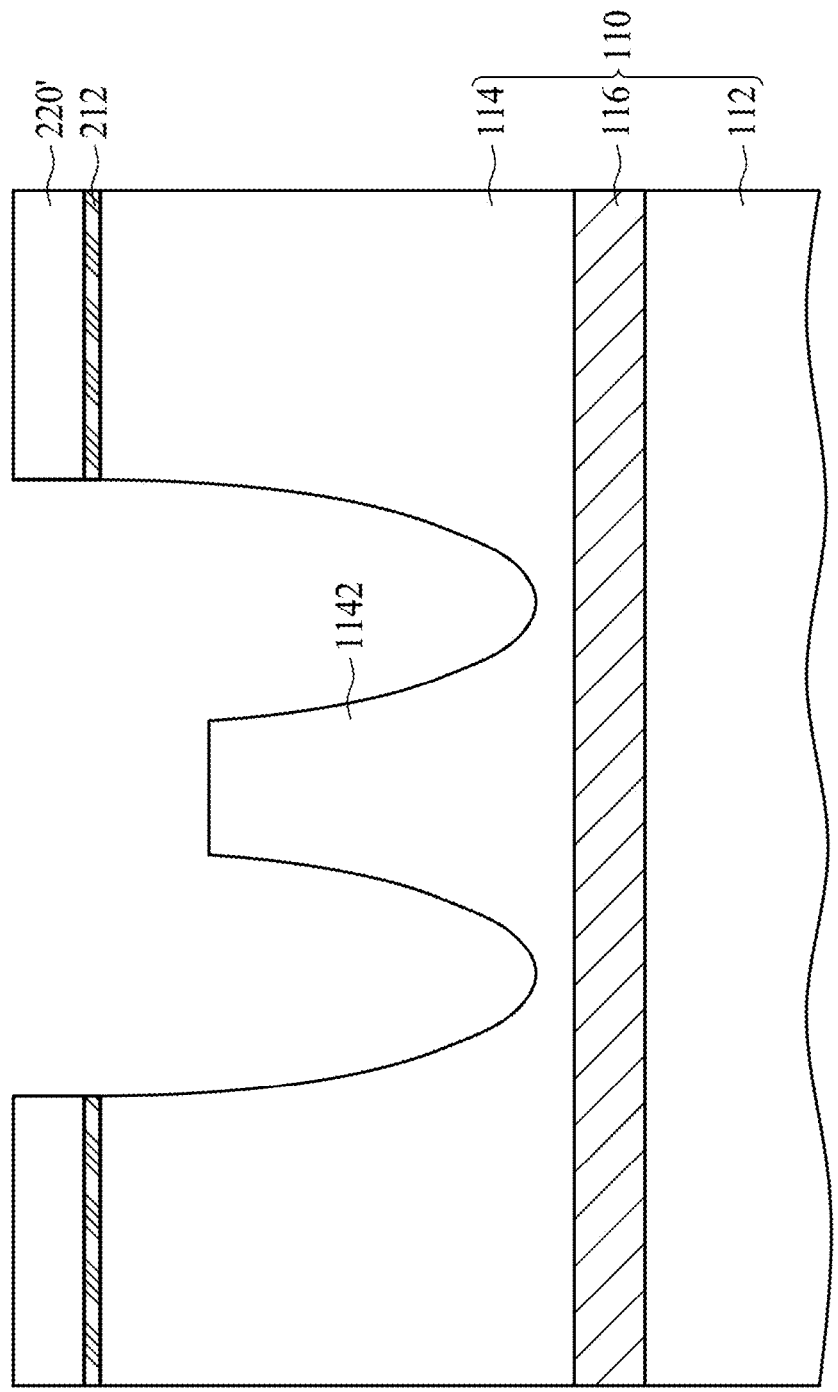

Referring to FIGS. 6, 7A and 7B, the buffer layer 210 and the second semiconductor layer 113 of the SOI substrate 110 are sequentially etched through the openings 226 to form a trench 120 penetrating through the buffer layer 210 and extending into the second semiconductor layer 113 according to a step S306 in FIG. 3. The buffer layer 210 and the SOI substrate 110 are anisotropically dry-etched, using at least one reactive ion etching (RIE) process, for example, through the openings 226 to form the trench 120.

Typically, the patterned mask 220 is consumed during the etching process. Due to a variation in thickness of the patterned mask 220 of the present disclosure, after the second segment 224 having less thickness is entirely consumed, a portion of the second semiconductor layer 113 of the SOI substrate 110, which was previously protected by the second segment 224 of the patterned mask 220, is etched, thereby forming a second semiconductor layer 114 including a protrusion 1142, and hence the trench 120 can have a substantially W-shaped contour. In some embodiments, the protrusion 1142 is disposed at center of the trench 120.

Referring again to FIG. 6, the second segment 224 of the patterned mask 220 has a width W4 employed to determine a topology of the second semiconductor layer 114 of the SOI substrate 110. Specifically, a smaller width W4 of the second segment 224 of the patterned mask 220 causes the protrusion 1142 to have a pointed end, as shown in FIG. 7A. In contrast, a greater width W4 of the second segment 224 can cause the protrusion 1142 to have a trapezoid shape, as shown in FIG. 7B. In some embodiments, bottoms of the trench 120 may be optionally rounded to reduce defect density and reduce electric field concentration during the operation of the device, thereby avoiding corner effects. The remaining patterned mask 220' is removed using an ashing process or a strip process, for example, after the trench 120 is formed. In some embodiments, the buffer layer 210 is then removed using a wet etching process, for example.

Figure 8:
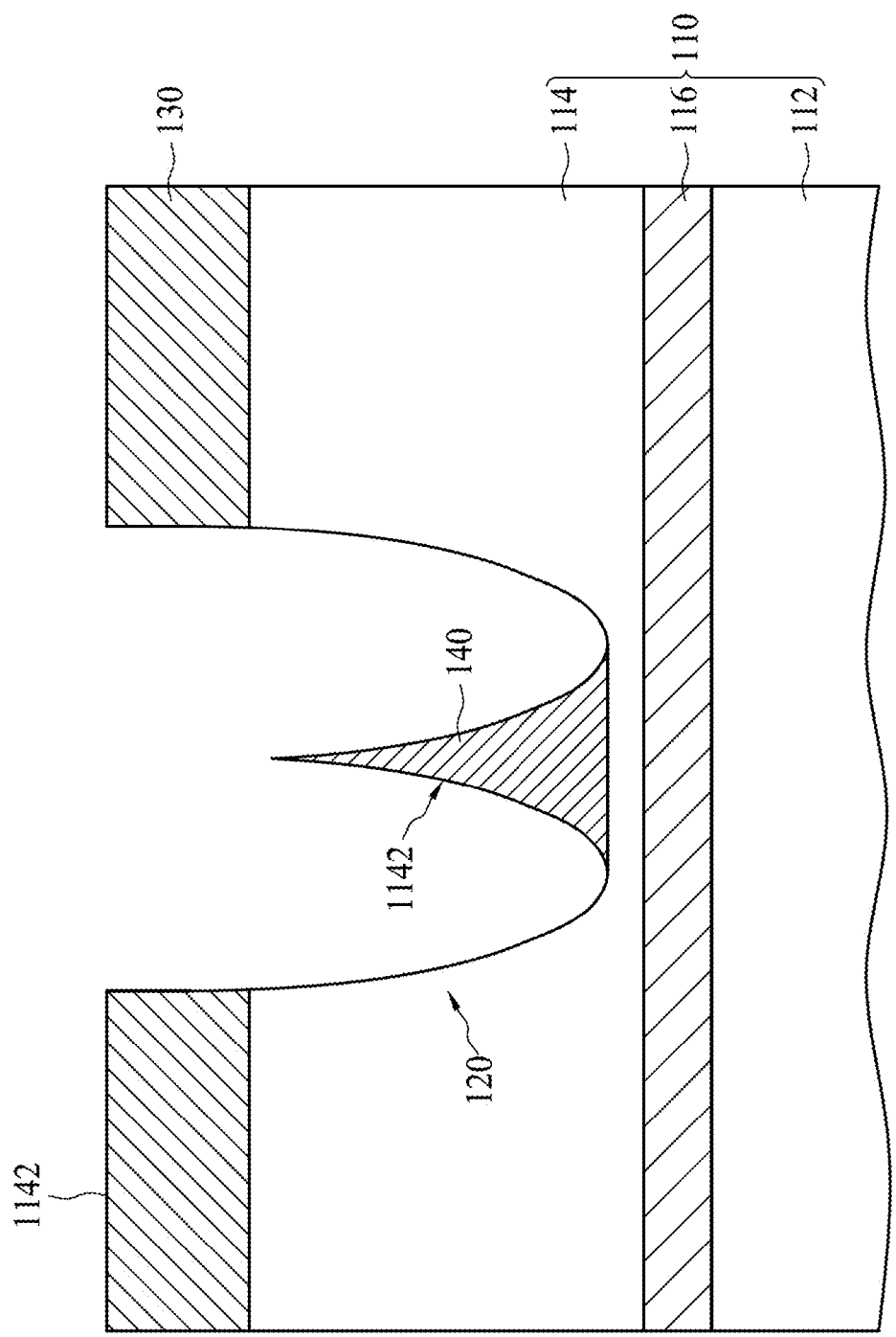
FIGS. 8 through 14 are cross-sectional views of intermediate stages in the formation of the semiconductor device in accordance with some embodiments of the present disclosure.

Referring to FIG. 8, dopants are introduced into the SOI substrate 110 to form a plurality of first impurity regions 130 and a second impurity region 140 according to a step S308 in FIG. 3. The first impurity regions 130 are formed by implanting dopants having a first conductivity type in regions of the second semiconductor layer 114, which is not etched. The first impurity regions 140 can serve as source/drain regions of the transistor. The first impurity regions 130 are connected to an upper surface 1142 of the second semiconductor layer 114. The first impurity regions 130 can be formed by a diffusion process or an ion-implantation process.

The second impurity region 140 is formed by implanting dopants having a second conductivity in the protrusion 1142 of the second semiconductor layer 114. The introduction of the dopants into the protrusion 1142 of the second semiconductor layer 114 is achieved by an ion-implantation process. In some embodiments, formation of the second impurity region 140 can be prior to the formation of the first impurity regions 130.

Figure 9:
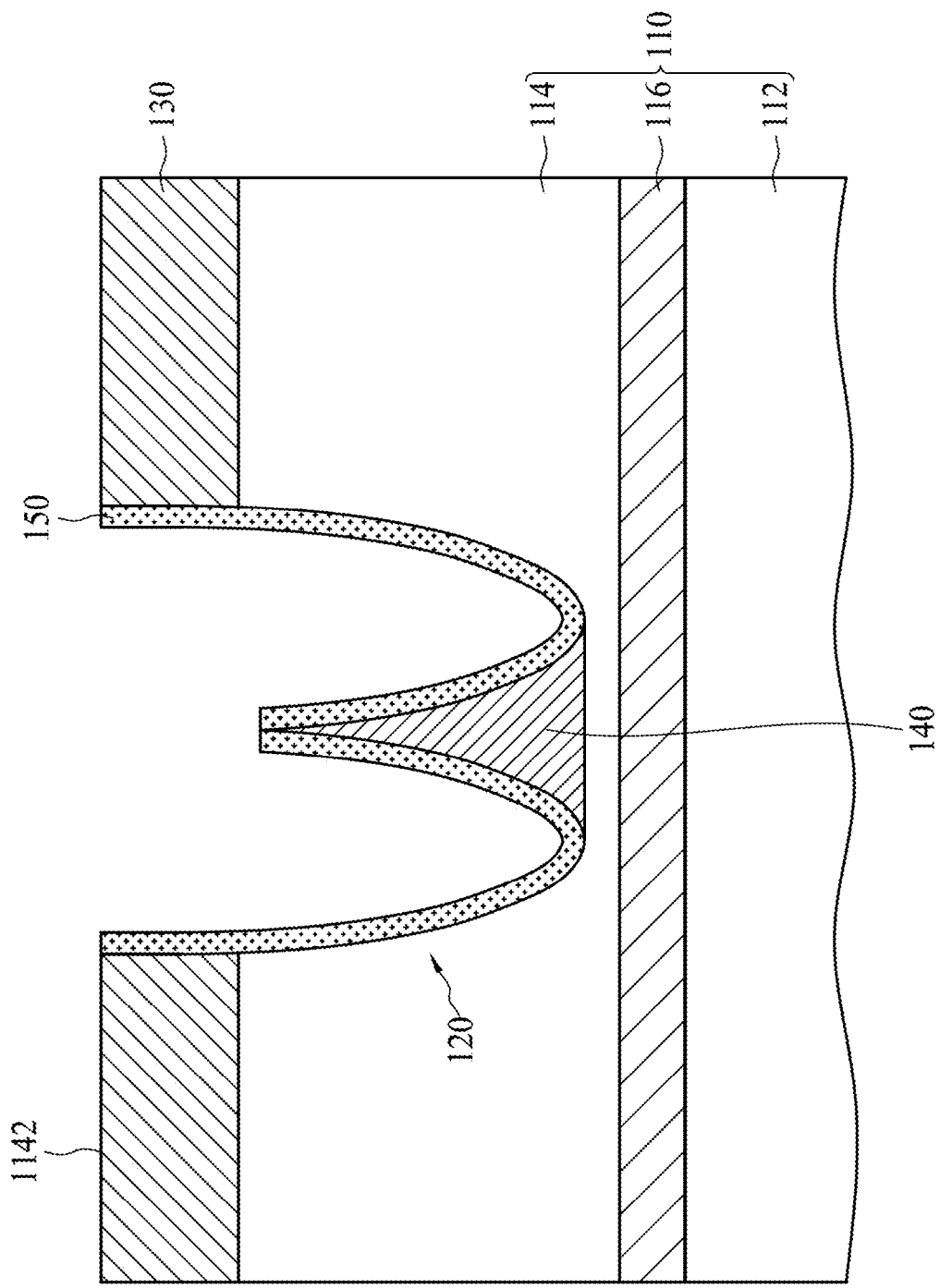

Referring to FIG. 9, an isolation film 150 is formed on a portion of the second semiconductor layer 114 of the SOI substrate 110 exposed by the trench 120 according to a step S310 in FIG. 3. The isolation film 150, having a substantially uniform thickness, covers the portion of the second semiconductor layer 114 exposed by the trench 120, but does not fill the trench 120. In other word, the isolation film 150 has a topology following the topology of the second semiconductor layer 114 of the substrate 110. In some embodiments, the isolation film 150 is grown on the exposed second semiconductor layer 114 using a thermal oxidation process. In alternative embodiments, the isolation film 150 can be formed using a CVD process or an atomic layer deposition (ALD) process; the deposited isolation film 150 not only covers the second semiconductor layer 114 exposed by the trench 120 but also the first impurity regions 130 (i.e., the upper surface 1142 of the second semiconductor layer 114). As a result, a removal process using etching process, for example, needs to be performed to remove portions of the deposited isolation film 150 from the first impurity regions 130. By way of example, the deposited isolation film 150 includes oxide, nitride, oxynitride or high-k material.

Figure 10:
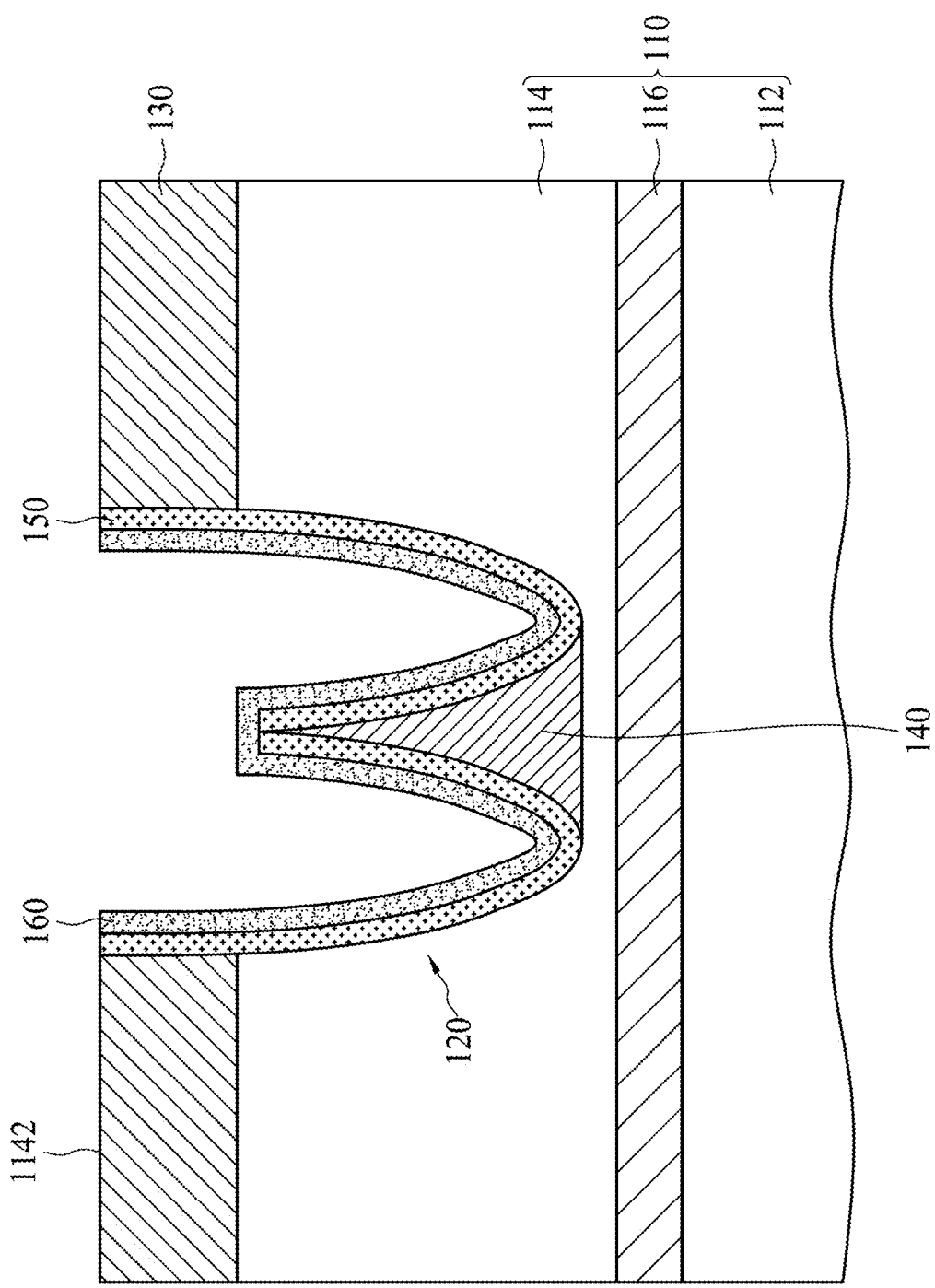

Referring to FIG. 10, a diffusion barrier film 160 is optionally deposited on the isolation film 150 according to a step S312 in FIG. 3. The diffusion barrier film 160, having a substantially uniform thickness, covers the isolation film 150, but does not fill the trench 120. In order to secure the step coverage, the diffusion barrier film 160 can be formed using a PVD process or an ALD process, for example, wherein the diffusion barrier film 160 deposited using the ALD process is highly uniform in thickness. In some embodiments, the diffusion barrier film 160 is uniformly and conformally deposited on the isolation layer 150 and the first impurity regions 130.

In some embodiments, the diffusion barrier film 160 is conformally and uniformly deposited on the first impurity regions 130 and the isolation film 150, so that a removal process is performed to remove the superfluous diffusion barrier film 160 on the upper surface 1142 of the second semiconductor layer 114, thereby exposing the first impurity regions 130. In some embodiments, the diffusion barrier film 160 may be a single-layered structure including refractory metals (such as tantalum and titanium), refractory metal nitrides, or refractory metal silicon nitrides. In alternative embodiments, the diffusion barrier film 160 may include a multi-layered structure including one or more refractory metals, refractory metal nitrides, or refractory metal silicon nitrides.

Figure 11:
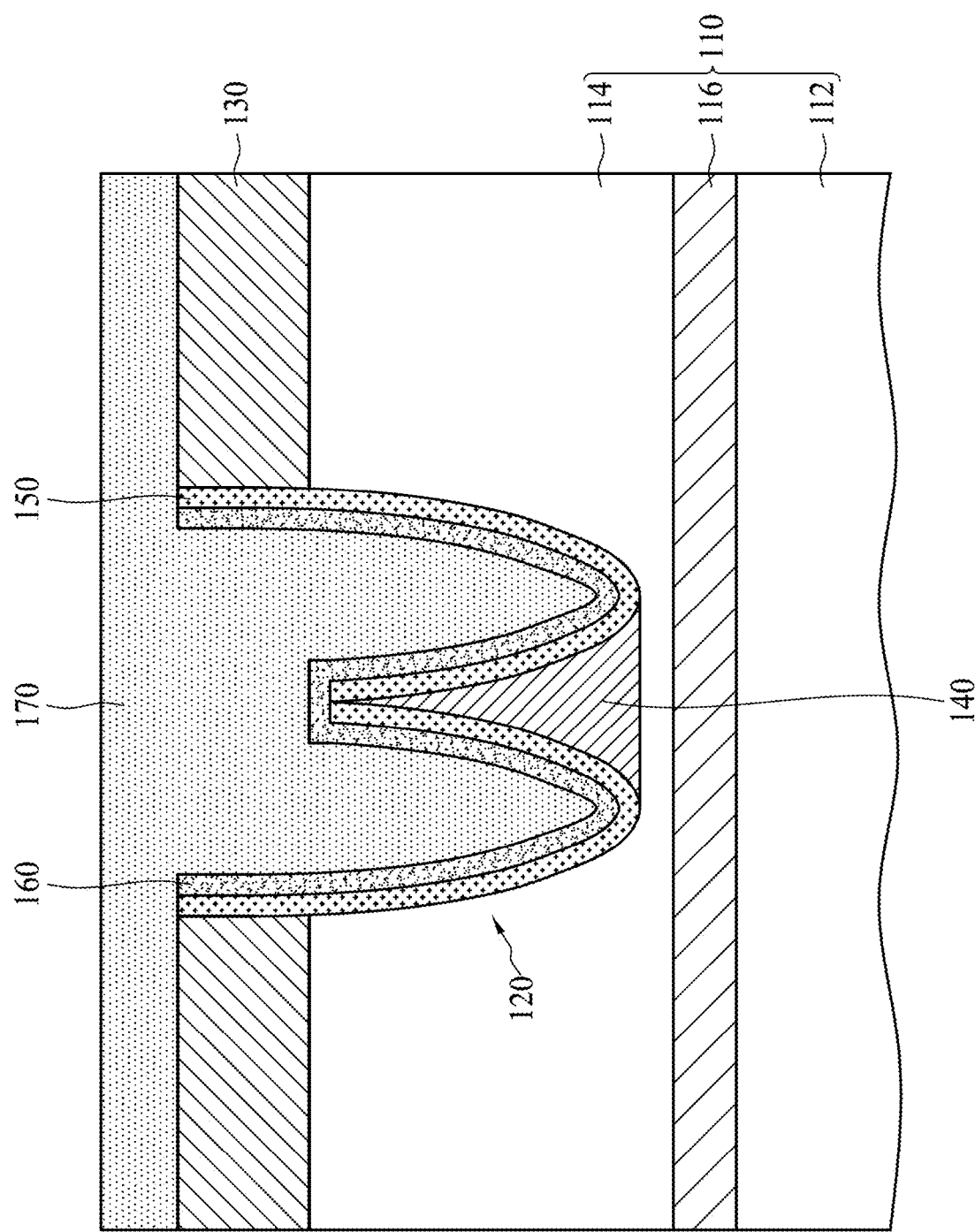

Referring to FIG. 11, a conductive material 170 is deposited to fill the trench 120 according to a step S314 in FIG. 3. The conductive material 170 is conformally and uniformly deposited on the first impurity regions 130 and the diffusion barrier film 160 in the trench 120 until the trench 120 is entirely filled. The conductive material 170 includes polysilicon or metal, such as tungsten, copper, aluminum, molybdenum, titanium, tantalum, ruthenium, or a combination thereof. The conductive material 170 may be formed using a CVD process, a PVD process, an ALD process or another suitable process.

Figure 12:
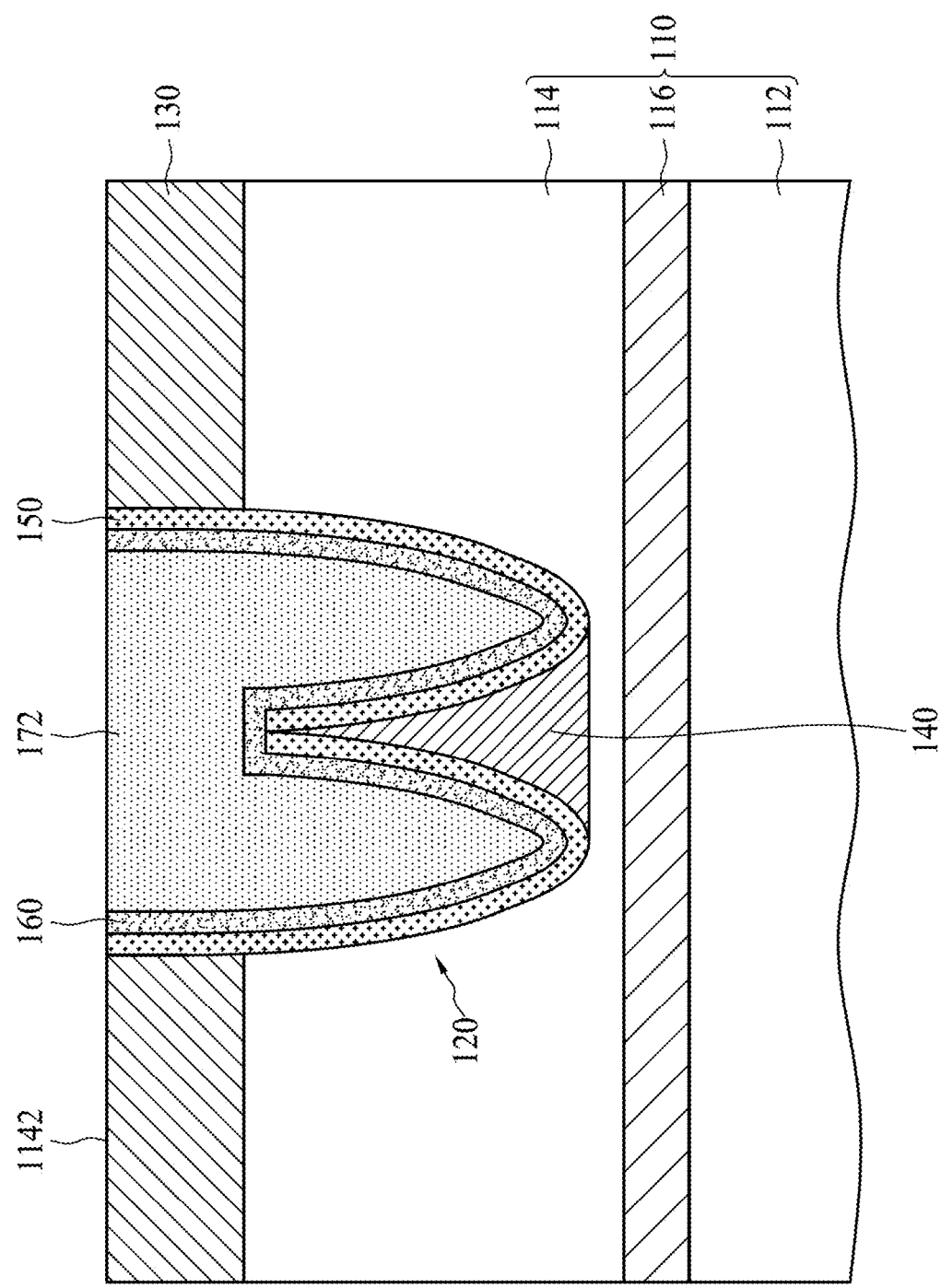
Figure 13:
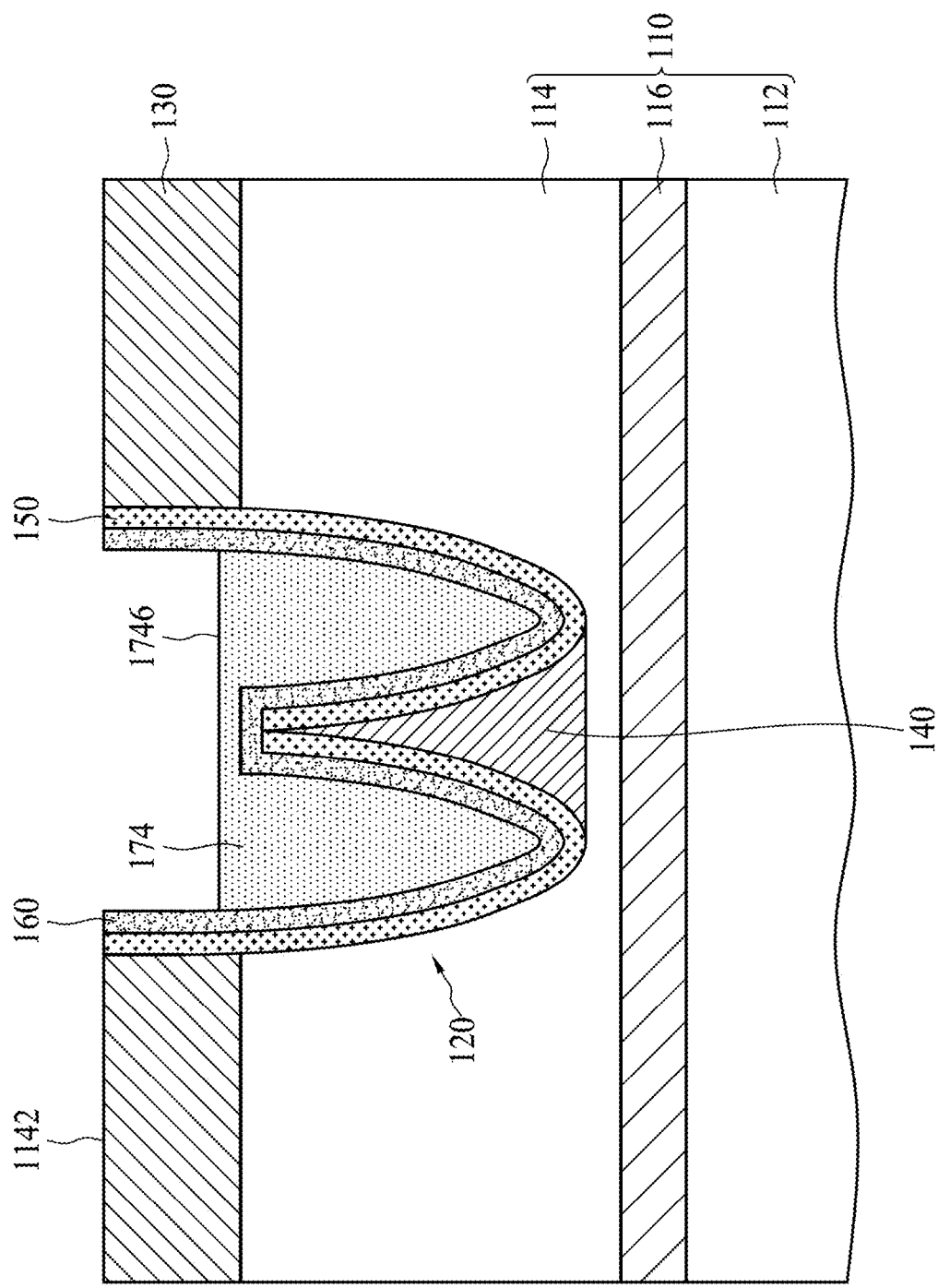

Referring to FIGS. 12 and 13, the conductive material 170 is recessed below the upper surface 1142 of the second semiconductor layer 114 of the SOI substrate 110 according to a step S316 in FIG. 3. Consequently, a word line 174 is formed. The formation of the word line 174 includes (1) performing one or more removal processes, including a polishing process and/or an etching process, to remove the conductive material 170 above the upper surface 1142 of the second semiconductor layer 114, and (2) etching the remaining conductive material 172 shown in FIG. 12 until it is below the upper surface 1142 of the second semiconductor layer 114. As shown in FIG. 13, the word line 174 has a top surface 1746 below the upper surface 1142 of the second semiconductor layer 114. In some embodiments, after the formation of the word line 174, the isolation film 150 and the diffusion barrier film 160 can be optionally recessed below the upper surface 1142 of the second semiconductor layer 114.

Figure 14:
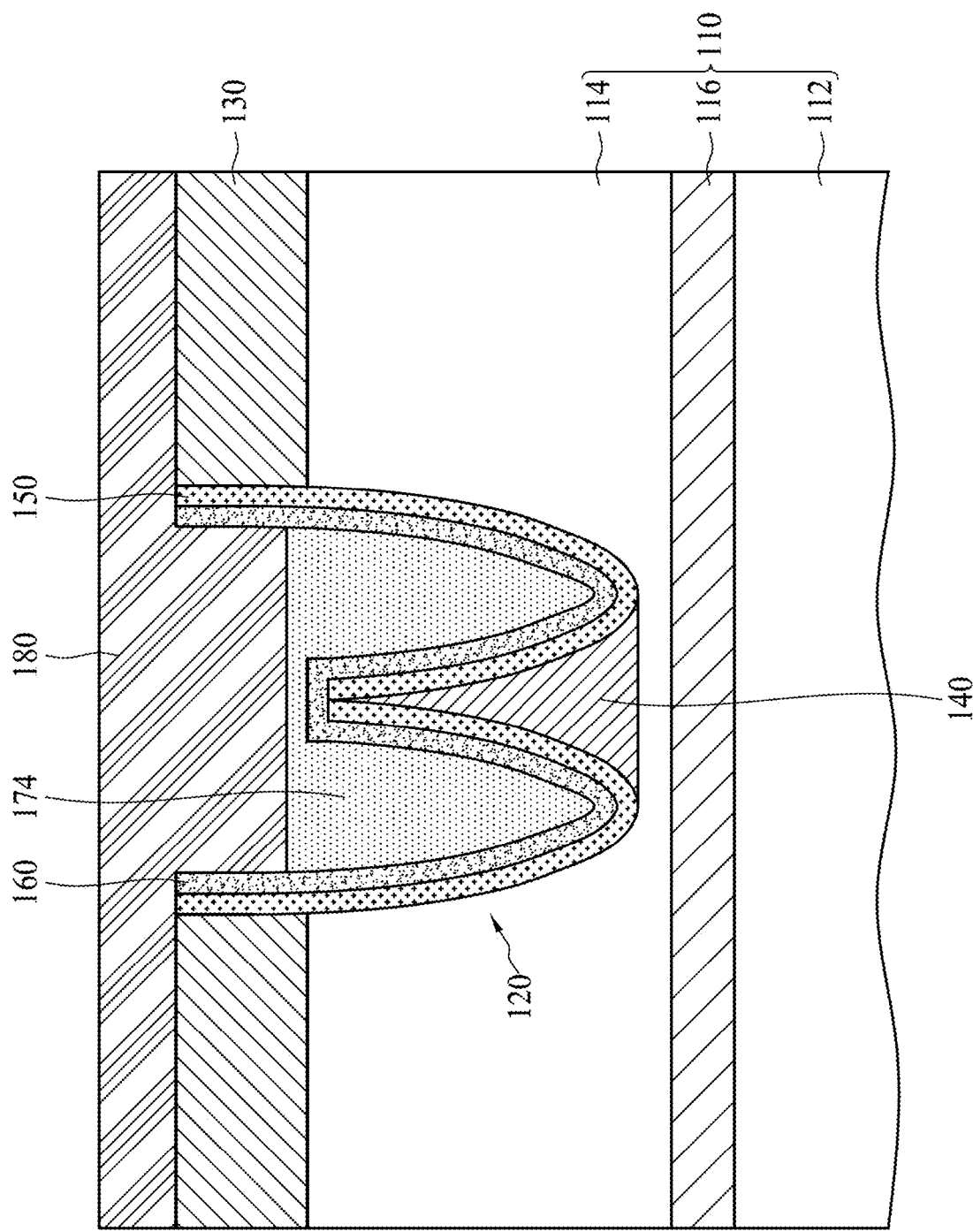

Referring to FIG. 14, a passivation layer 180 is deposited to fill the trench 120 according to a step S318 in FIG. 3. The passivation layer 180 is conformally and uniformly deposited on the first impurity regions 130 and the word line 174. The passivation layer 180 can be deposited using a CVD process or an ALD process, wherein the ALD process has a good coverage to form a void-free passivation layer 180. In some embodiments, the passivation layer 180 may include silicon oxide, silicon nitride, silicon oxynitride, hafnium dioxide, or zirconium dioxide. After the deposition of the passivation layer 180, one or more removal processes, including etching processes and/or polishing processes, can be performed to remove the superfluous passivation layer 180. Accordingly, the passivation layer 182 in the second semiconductor layer 114 of the SOI substrate 110 capping the word line 172 is formed, thereby forming the semiconductor device 10 shown in FIG. 1.

In conclusion, with the configuration of the semiconductor device 10/10A having the W-shaped word line 170 and the second impurity region 140 disposed between the legs 1744 of the word line 174 and having the conductivity type different from the second semiconductor layer 114 of the substrate 110 and the first impurity regions 130, a wider channel is provided and the bias voltage applied to the word line for controlling operation states (i.e., conducting or non-conducting states) of the RAD transistor can be reduced.

One aspect of the present disclosure provides a semiconductor device. The semiconductor device comprises a substrate, a word line, a plurality of first impurity regions, a second impurity region, and an isolation film. The word line is disposed in the substrate and comprises a base and a pair of legs connected to the base. The plurality of first impurity regions are disposed in the substrate and on either side of the word line. The second impurity region is disposed in the substrate and between the legs of the word line. The isolation film is disposed in the substrate, wherein the word line is surrounded by the isolation film.

One aspect of the present disclosure provides a method of manufacturing a semiconductor device. The method comprises steps of providing a patterned mask having a plurality of openings on a substrate; etching the substrate through the openings to form an etched substrate and a trench in the etched substrate, wherein the etched substrate comprises a protrusion; introducing dopants having a first conductivity type in the etched substrate and on either side of the trench to form a plurality of first impurity regions; introducing dopants having a second conductivity type in the protrusion of the etched substrate to form a second impurity region; forming an isolation film on the substrate in the trench; and depositing a conductive material on the isolation film.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor device, comprising:
a substrate;
a word line disposed in the substrate and comprising a base and a pair of legs connected to the base;
a plurality of first impurity regions disposed in the substrate and on either side of the word line;
an isolation film disposed in the substrate, wherein the word line is surrounded by the isolation film; and
a second impurity region disposed in the substrate and between the legs of the word line;
wherein the substrate and the first impurity regions have the same conductivity type, and the first impurity regions and the second impurity region have different conductivity types;
wherein the substrate comprises a first semiconductor layer, a second semiconductor layer and an insulator layer sandwiched between the first and second semiconductor layers; the word line, the first and second impurity regions, and the isolation film are disposed in the second semiconductor layer of the substrate; and the legs of the word line are disposed between the base of the word line and the insulator layer.

2. The semiconductor device of claim 1, wherein the second impurity region has a width that gradually increases at positions of increasing distance from the base of the word line.

3. The semiconductor device of claim 1, wherein sections of the isolation film attached to the legs of the word line are connected with each other.

4. The semiconductor device of claim 1, wherein the isolation film comprises:
a pair of curved sections attached to the legs of the word line; and
a horizontal section sandwiched between the base of the word line and the second impurity region and connected to the curved sections.

5. The semiconductor device of claim 1, wherein the substrate has a first doping concentration, and the first impurity regions have a second doping concentration greater than the first doping concentration.

6. The semiconductor device of claim 1, wherein the base and the legs of the word line are integrally formed.

7. The semiconductor device of claim 1, further comprising a passivation layer disposed in the substrate and capping the base of the word line.

8. The semiconductor device of claim 7, wherein the passivation layer is surrounded by the isolation film.

9. The semiconductor device of claim 7, wherein the passivation layer contacts the first impurity regions.

* * * * *